(12) United States Patent
Zhu et al.

(10) Patent No.: US 9,412,966 B2
(45) Date of Patent: Aug. 9, 2016

(54) OLED ENCAPSULATING STRUCTURE AND MANUFACTURING METHOD THEREOF, AND LIGHT-EMITTING DEVICE

(71) Applicant: BOE Technology Group Co., Ltd., Beijing (CN)

(72) Inventors: Ruhui Zhu, Beijing (CN); Junsheng Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 37 days.

(21) Appl. No.: 14/011,177

(22) Filed: Aug. 27, 2013

(65) Prior Publication Data
US 2014/0061619 A1    Mar. 6, 2014

(30) Foreign Application Priority Data
Aug. 30, 2012   (CN) .......................... 2012 1 0316729

(51) Int. Cl.
| | | |
|---|---|---|
| H01L 29/08 | (2006.01) | |
| H01L 21/00 | (2006.01) | |
| H01L 51/40 | (2006.01) | |
| H01L 51/00 | (2006.01) | |
| H01L 51/52 | (2006.01) | |
| H01L 33/52 | (2010.01) | |
| H01L 33/58 | (2010.01) | |
| H01L 51/56 | (2006.01) | |

(52) U.S. Cl.
CPC .......... *H01L 51/5237* (2013.01); *H01L 33/52* (2013.01); *H01L 33/58* (2013.01); *H01L 51/5253* (2013.01); *H01L 51/5256* (2013.01); *H01L 51/5268* (2013.01); *H01L 51/5275* (2013.01); *H01L 51/56* (2013.01)

(58) Field of Classification Search
CPC ..... H01L 33/52; H01L 33/58; H01L 51/5268; H01L 51/5275; H01L 51/5253; H01L 51/5256
USPC .............. 257/40, 98, 100, E51.018, E33.073, 257/E33.075, E33.059; 438/22, 99
See application file for complete search history.

(56) References Cited

U.S. PATENT DOCUMENTS

| | | | |
|---|---|---|---|
| 7,521,860 B2 * | 4/2009 | Tsai et al. ..................... | 313/506 |
| 2003/0085652 A1 | 5/2003 | Weaver | |
| 2006/0055294 A1 | 3/2006 | Song et al. | |

(Continued)

FOREIGN PATENT DOCUMENTS

| | | |
|---|---|---|
| CN | 1582504 A | 2/2005 |
| CN | 1747612 A | 3/2006 |
| CN | 1770483 A | 5/2006 |

OTHER PUBLICATIONS

English abstract of CN1770483A, 1 page.
First Office Action (Chinese language) issued by the State Intellectual Property Office ("SIPO") on Oct. 8, 2014 for international application No. 2012103167290, 6 pages.

(Continued)

*Primary Examiner* — Robert Huber
(74) *Attorney, Agent, or Firm* — Ladas & Parry LLP

(57) ABSTRACT

An OLED encapsulating structure and a manufacturing method thereof, and a light-emitting device are disclosed. The OLED encapsulating structure comprises: a base substrate, an OLED, barrier layers, and optical modulation layers; the OLED is formed on the base substrate; the barrier layers and the optical modulation layers are alternately and periodically formed on the OLED. The OLED encapsulating structure can reduce viewing-angle dependence of an OLED caused by a micro-cavity effect.

12 Claims, 3 Drawing Sheets

(56) References Cited

U.S. PATENT DOCUMENTS

| | | |
|---|---|---|
| 2007/0046187 A1 | 3/2007 | Tsai et al. |
| 2008/0212921 A1* | 9/2008 | Gaylord et al. .............. 385/14 |
| 2009/0015757 A1* | 1/2009 | Potts et al. .................... 349/69 |
| 2011/0132449 A1* | 6/2011 | Ramadas et al. ............ 136/256 |

OTHER PUBLICATIONS

English translation of first Office Action issued by SIPO for international application No. 2012103167290, 3 pages.
English abstract of CN1582504A, 1 page.
First Chinese Office Action dated Jun. 2, 2016; Appln. No. 201510098156.2.

* cited by examiner

OLED ENCAPSULATING STRUCTURE AND MANUFACTURING METHOD THEREOF, AND LIGHT-EMITTING DEVICE

CROSS REFERENCE TO RELATED APPLICATIONS

This application claims priority from Chinese National Application No. 201210316729.0 filed on Aug. 30, 2012, the contents of which are incorporated herein by reference.

TECHNICAL FIELD

Embodiments of the present disclosure relate to an organic light-emitting device (OLED) encapsulating structure and a manufacturing method thereof, and a light-emitting device.

BACKGROUND

Organic light-emitting devices (OLEDs) are regarded as the third-generation display technology, because they have advantages such as active light-emission, good temperature characteristics, low power consumption, fast response, flexibility, ultra-thin and low costs.

According to light-emission directions, an OLED can be divided into three types: bottom-emission OLED, top-emission OLED, and double-emission OLED. A bottom-emission OLED refers to an OLED with light emission from a substrate; a double-emission OLED refers to an OLED with light emission from both a substrate and the top of the device; a top-emission OLED refers to an OLED with light emission from the top of the device. Because it does not affect a top-emission OLED whether or not a substrate is light-transmitting, the aperture ratio of a display panel can be effectively improved, the design of a TFT circuit on a substrate can be expanded, and the choices of electrode materials can be widened; furthermore, the integration of the device with a TFT circuit can be facilitated. An OLED is very sensitive to moisture and oxygen, and therefore moisture and oxygen that penetrates into the inside of the OLED will corrode the organic functional layer and the electrode material, which severely affects the service-life of the device. Therefore, in order to prolong device's service-life and improve device's stability, it is necessary to have an OLED subjected to an encapsulating treatment to form an OLED encapsulating structure, for example, a barrier layer may be formed on the OLED, and the barrier layer may comprise an inorganic insulating layer and an organic insulating layer, so as to prevent moisture and oxygen from penetration into the OLED.

A top-emission OLED can improve device's efficiency, narrow spectrums and improve color-purity, but often suffers micro-cavity effect. Micro-cavity effect will cause the light-emitting spectra of an OLED to change along with the viewing angle, which results in that a viewing-angle dependence problem occurs to the OLED.

SUMMARY

Embodiments of the present disclosure provide an OLED encapsulating structure and a manufacturing method thereof and a light-emitting device, which can reduce viewing-angle dependence of an OLED caused by a micro-cavity effect.

One aspect of the present disclosure provides an OLED encapsulating structure comprising: a base substrate, an OLED, barrier layers and optical modulation layers; the OLED is formed on the base substrate; the barrier layers and the optical modulation layers are alternately formed on the OLED.

Another aspect of the present disclosure provides a manufacturing method of an OLED encapsulating structure comprising: forming an OLED on a base substrate; barrier layers and optical modulation layers are alternately formed on the OLED.

Yet another aspect of the present disclosure further provides a light-emitting device comprising the above OLED encapsulating structure.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

In order to make objects, technical details and advantages of the embodiments of the disclosure apparent, the following description will be connected with the drawings related to the embodiments of the disclosure.

DETAILED DESCRIPTION

Below, in connection with the drawings, an OLED encapsulating structure and a manufacturing method thereof and a light-emitting device, provided by the present disclosure, will be described in detail.

Unless otherwise defined, technical jargon or scientific terms used herein should be interpreted in the usual sense as understood by those ordinary skilled in the relevant art of the present disclosure. The terms "first", "second", and the like, used in the specification and claims of this patent application of the disclosure, do not denote any order, quantity, or importance, but are used to distinguish among different integral parts. Similarly, the words "a", "an," "the," and the like, herein do not denote a limitation of quantity, but denote the presence of at least one of the referenced item. The words "comprising" or "comprising" or the like, are referred to that the elements or objects which appear before the words encompass the elements or objects and their equivalents which are enumerated after the words, and do not exclude other elements or objects. The terms "connection" or "interconnection" or the like, are not limited to physical or mechanical connections, but may comprise electrical connection, whether direct or indirect. "On", "under", "left", "right" and the like, are only used to indicate a relative positional relationship, which may be correspondingly changed as an absolute position of a described object is changed.

Figure 1:
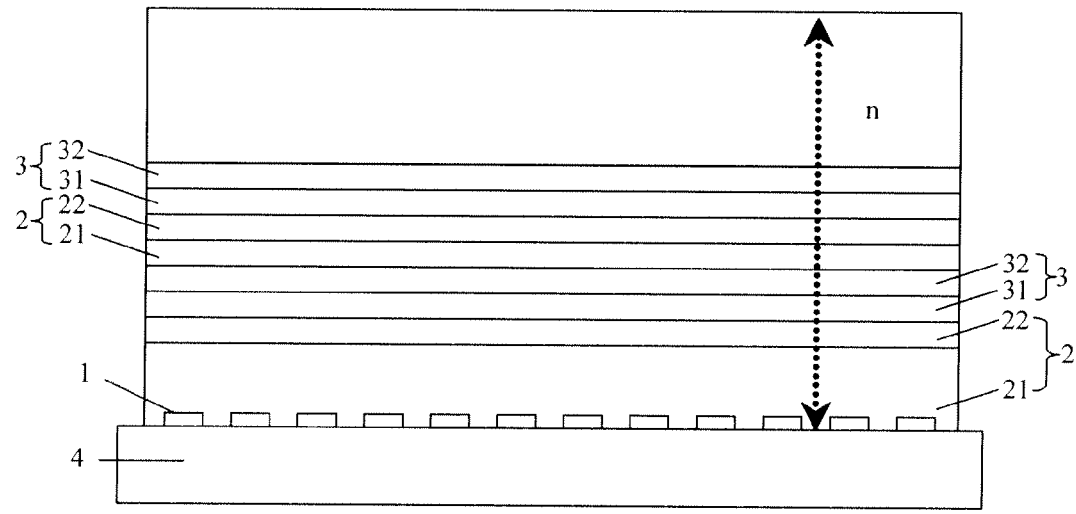
FIG. 1 is a schematic structural diagram of an OLED encapsulating structure provided by a first embodiment of the present disclosure.

FIG. 1 is a schematic structural diagram of an OLED encapsulating structure provided by a first embodiment of the present disclosure. As illustrated in FIG. 1, the OLED encapsulating structure comprises: a base substrate 4, at least one OLED 1, a plurality of barrier layers 2 and a plurality of optical modulation layers 3. The plurality of barrier layers 2 and the plurality of optical modulation layers 3 are alternately provided on the OLED 1.

In this embodiment, for example, the barrier layers 2 and the optical modulation layers 3 may be alternately and periodically formed on the OLED 1 in accordance with a number of alternating cycles; in each alternating cycle, one of the optical modulation layers 3 is provided on one of the barrier layers 2. That is, on the OLED 1, the barrier layers 2 and the optical modulation layers 3 are repeatedly formed on the OLED 1 in an order of "barrier layer 2—optical modulation layer 3" in accordance with the number of alternating cycles.

The number of alternating cycles is a positive integer. For example, the number of alternating cycles n is a positive integer, and for example may be greater than or equal to 1 and less than or equal to 10, i.e., $1 \leq n \leq 10$.

In this embodiment, the optical modulation layers 3 and the barrier layers 2 are alternately formed on the OLED 1, and in each alternating cycle, the optical modulation layer 3 is provided on the barrier layer 2. As illustrated in FIG. 1, in the case where the number n is greater than or equal to 2, in the first alternating cycle, a barrier layer 2 is directly formed on the OLED 1, whereas in the other alternating cycles, a barrier layer 2 is formed on an optical modulation layer 3 that is formed in the previous alternating cycle.

In practice, for example, the barrier layers 2 and the optical modulation layers 3 also may be alternately formed in other alternating forms on the OLED 1. For example, the barrier layers 2 and the optical modulation layers 3 are alternately formed in the order of "barrier layer 2—optical modulation layer 3—barrier layer 2" on the OLED 1.

The OLED 1 may be a top-emission OLED or a double-emission OLED. In this embodiment, the OLED 1 is implemented as a top-emission OLED. The OLED 1 may comprise: an anode, an organic light emitting layer, and a cathode; the anode is formed on the base substrate 4, the organic light emitting layer is formed on the anode, and the cathode is formed on the organic light emitting layer. Optionally, the OLED 1 may further comprise at least an organic functional layer. For example, the organic functional layer may comprise one or more layers selected from a hole injection layer, a hole transport layer, an electron transport layer and an electron injection layer. A hole injection layer and a hole transport layer may be provided between the anode and the organic light emitting layer; an electron transport layer and an electron injection layer may be provided between the organic light emitting layer and the cathode layer.

In one example, the OLED 1 comprises: an anode on the base substrate 4, and a hole injection layer, a hole transport layer, an organic light emitting layer, an electron transport layer, an electron injection layer and a cathode, which are sequentially provided from bottom to top on the surface of the anode.

For example, the material of the anode may comprise silver (Ag), indium tin oxide/silver/indium tin oxide (ITO/Ag/ITO) laminate or nickel-chrome (Ni:Cr) alloy. The material of the hole injection layer may comprise:
4,4',4''-tris(N-3-methyl-phenyl-N-phenylamino)triphenylamine (m-MTDATA),
4,4',4''-tris(N,N-diphenyl amino)triphenylamine (TDATA),
4,4',4''-tris[2-naphthylphenylamino]triphenylamine (2-TNATA) or
(N,N,N',N'-tetramethoxyl-phenyl)-benzidine (MeO-TPD), etc. The material of the hole transport layer may comprise: N,N'-diphenyl-N,N'-(1-naphthyl)-1,1'-biphenyl-4,4'-diamine (alpha-NPB), N,N'-diphenyl-N,N'-bis(3-methylphenyl)-1,1'-biphenyl-4,4'-diamine (TPD), or 3-(biphenyl-4-yl)-5-(4-tert-butylphenyl)-4-phenyl-4H-1,2,4-triazole (TAZ), etc. The material of the organic light emitting layer may comprise: a fluorescent host material; for example, the fluorescent host material may comprise: a metal complex, such as 8-hydroxyquinoline aluminum (Alq3) or anthracene derivatives substituted with two aromatic groups such as 9,10-bis(2-naphthyl)anthracene (AND), etc., and the above-mentioned fluorescent host materials may be doped with coumarin, such as N,N'-dimethyl quinacridone (DMQA), 10-(2-Benzothiazolyl)-2,3,6,7-tetrahydro-1,1,7,7-tetramethyl-1H,5H,11H-(1) benzopyropyrano(6,7-8-I,j)quinolizin-11-one (C545T), or the fluorescent materials may be doped with double-pyran such as 4-(dicyanomethylene)-2-tert-butyl-6-(1,1,7,7-tetramethyl-julolidinyl-4-vinyl)-4H-pyran (DCJTB), or the fluorescent materials may be doped with other materials such as 4,4'-(di(9-ethyl-3-vinyl carbazole)-1,F-biphenyl (BczVBi), 1,4,7,10-tetra-tert-butyl perylene (TBPe), Rubrene, etc.; alternatively, the material of the organic light emitting layer may also comprise: a phosphorescent host carbazole derivative such as (9,9'-(1,3-phenylene)bis-9H-carbazole (MCP) or 4,4'-(9-carbazolyl)biphenyl (CBP), etc., the above-mentioned phosphorescent host carbazole derivative may be doped with phosphorescent dyes, for example: phosphorescent dyes may comprise:
tris(dibenzoylmethane)mono(phenanthroline)erbium(Er (dbm)3(phen)),
tris(2-phenylpyridine)iridium(Ir(ppy)3), or bis(4,6-difluorophenyl pyridine-N,C2)iridium pyridine carboxamide (Firpic) etc. The material of the electron transport layer may comprise:
8-hydroxyquinoline-lithium(Liq), 8-hydroxyquinoline aluminum(Alq3),
4,7-diphenyl-1,10-phenanthroline (Bphen) or
bis(2-methyl-8-hydroxyquinoline-N1,O8)-(1,1'-biphenyl-4-hydroxy)aluminum (Balq), etc.; the material of the electron injection layer may comprise: organic materials such as 8-hydroxyquinoline-lithium(Liq) or 4 (8-hydroxyquinoline)lithium boron (LiBq4), and also may comprise an inorganic material such as lithium fluoride (LiF), or lithium nitride ($Li_3N$), etc.; the material of the cathode may comprise magnesium-silver (Mg:Ag) alloy, an aluminum/silver (Al/Ag) laminate or a calcium/silver(Ca/Ag) laminate.

Each of the barrier layers 2 may comprise: an inorganic insulating layer 21 and an organic insulating layer 22 provided on the inorganic insulating layer 21. The material of the inorganic insulating layer 21 may comprise an oxide, a sulfide, a nitride, a nitrogen oxide or a carbon film. For example, the material of the inorganic insulating layer 21 may be aluminum oxide ($Al_2O_3$), silicon nitride ($Si_3N_4$), silicon oxynitride (SiOxNy), or diamond-like carbon. The thickness of the inorganic insulating layer 21 may be ranged from 50 nm to 500 nm, and e.g., may be about 100 nm. As illustrated in FIG. 1, it should be noted that, in the first alternating cycle, since the inorganic insulating layer 21 needs to cover the underlying OLED 1, the inorganic insulating layer 21 in the first alternating cycle may have a thickness greater than the thickness of any other inorganic insulating layer 21 in other alternating cycles. The material of the organic insulating layer 22 may be UV-curable adhesive, polymethyl methacrylate, polyimide, parylene, polyacrylate or acrylate monomer. The thickness of the organic insulating layer 22 may be ranged from 500 nm to 2000 nm, and e.g., may be about 1000 nm. The barrier layers 2 have oxygen-and-water resistance function, which can block moisture and oxygen from penetrating into the OLED 1, thereby preventing moisture and oxygen from contacting with and degrading the OLED 1.

Optionally, each of the barrier layers 2 also may comprise an inorganic insulating layer only; alternatively, each of the barrier layers 2 also may comprise an organic insulating layer only.

Each of the optical modulation layer 3 comprises a grid layer 31 and a filler layer 32 provided above the grid layer 31. The filler layer 32 is filled within the hollow spaces within the grid layer 31 and covers the grid layer 31 from the above. The grid layer 31 and the filler layer 32 may be prepared by applying glancing angle deposition technique.

Figure 2:
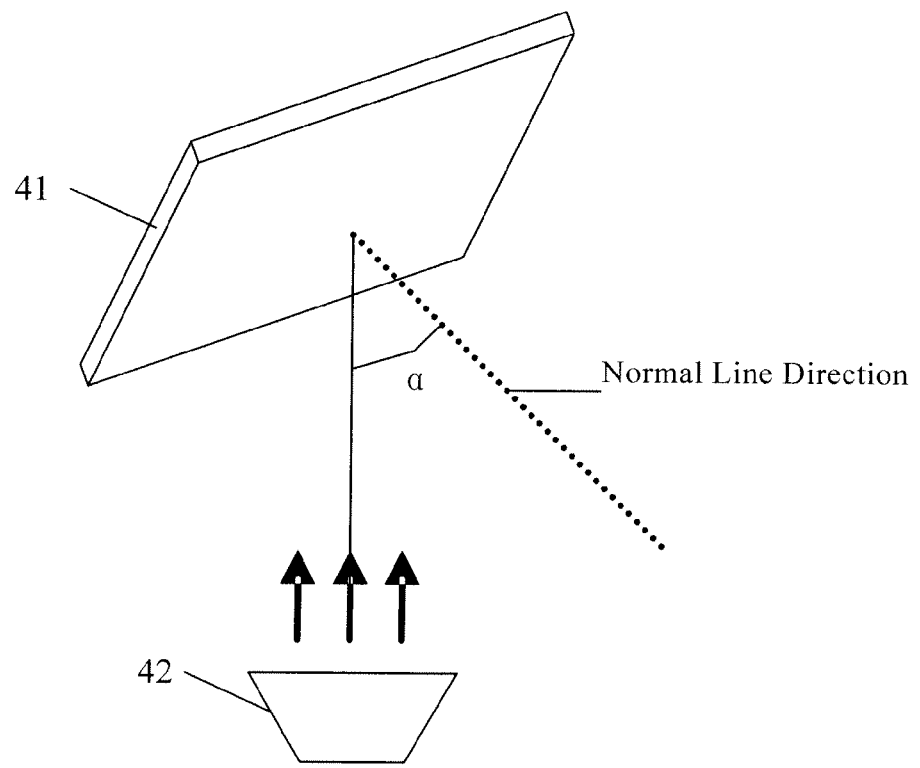
FIG. 2 is a schematic diagram illustrating an application of glancing angle deposition technique.
Figure 3:
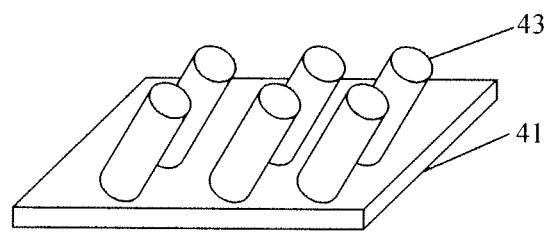
FIG. 3 is a schematic diagram of a nanorod structure.

FIG. 2 is a schematic diagram illustrating an application of glancing angle deposition technique. As illustrated in FIG. 2, the glancing angle deposition technique refers to such a technique used to deposit a thin-film material at an oblique angle on a target substrate 41 in vacuum, which is one of the methods for preparing an optical thin film. When an evaporation source 42 deposits the relevant evaporable substance onto the target substrate 41 at an incident angle a with respect to a normal line of the substrate, under the action of self-shadowing effect, the growth of the evaporable substance on the substrate 41 has priority along the steam-injection direction and results in a nanorod structure 43 with voids among the nanorods in a thin-film as a whole. The nanorod structure 43 is illustrated in FIG. 3. The material of the evaporable substance may comprise a metal, an oxide or a fluoride; for example, the metal may be Au, Ag, Co, Fe, Ni, W or any alloy thereof, and the oxide may be $SiO_2$, $TiO_2$ or $ZrO_2$, and the fluoride may be $MgF_2$. With variations of the incident angle a during the depositing process, the thin-film nanorod structure 43 will give rise to different porosity, thereby changing the refractive-index distribution of the resultant film, and possibly having a continuous change in the refractive index. The porous nanorod structure 43 obtained through glancing angle deposition has a relatively lower refractive index than a natural material and close to the refractive index of atmosphere air, thus it can effectively reduce reflection; moreover, such a nanorod structure 43 can have a scattering property. The grid layer 31 and the filler layer 32 can be both formed of an obliquely-upward-grown nanorod thin film.

Figure 4:
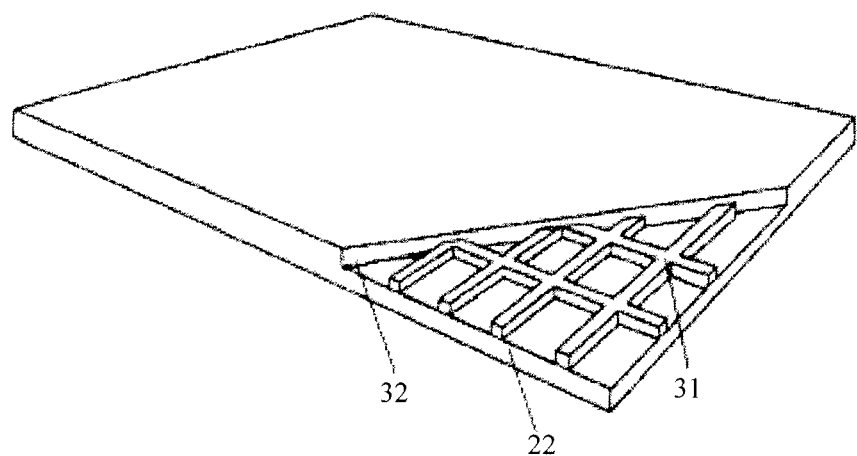
FIG. 4 is an enlarged partial section-view of a grid layer illustrated in FIG. 1.

FIG. 4 is an enlarged partial section-view of a grid layer illustrated in FIG. 1. As illustrated in FIG. 4, the grid layer 31 is provided on the organic insulating layer 22 and under the filler layer 32. The grid layer 31 is in a grid structure, and the filler layer 32 is filled within the hollow spaces of the grid structure and covers the entire grid layer 31 from the above. The grid layer 31 may be distributed in a non-light-emitting area of the pixel units on the base substrate. The display device to be formed comprises a plurality of pixel units which are arranged in an array. In order to form the grid layer 31 in a grid structure, a patterned mask may be used for blocking during the growing process of the thin-film for the grid layer 31 to achieve a pattern that forms a grid structure on the grid layer 31. The grid layer 31 may be formed of a successively obliquely-grown nanorod thin film in a tri-layer structure of metal/dielectric/metal; the metal may be silver (Ag), aluminum (Al) or a mixture of silver and aluminum, and the dielectric may be one or more from silicon dioxide ($SiO_2$) and magnesium fluoride ($MgF_2$), for example, the dielectric may be either of silicon dioxide ($SiO_2$) and magnesium fluoride ($MgF_2$). The filler layer 32 may be formed of an obliquely-upward-grown oxide nanorod thin film, and the refractive index of the nanorod thin film becomes from large to small along the direction away from the grid layer 31. Thus, during the process that light is incident from the side of the filling layer 32 having a large refractive index and exits from the side thereof having a small refractive index, the probability of total reflection of light is greatly reduced, thereby increasing the amount of light emission. The oxide may comprise titanium dioxide ($TiO_2$), aluminum oxide ($Al_2O_3$), zinc oxide (ZnO), magnesium oxide (MgO) or zirconium oxide ($ZrO_2$); in other words, the material of the filler layer 32 may be titanium dioxide ($TiO_2$), aluminum oxide ($Al_2O_3$), zinc oxide (ZnO), magnesium oxide (MgO) or zirconium oxide ($ZrO_2$). Due to antiphase dipole resonance produced by the two layers of metal nanorod thin film in the grid layer 31, the nanorod thin film as dielectric exhibits the characteristics of a negative refractive index. The dielectric with a negative refractive index has such a physical property that: light has opposite directions of propagation of the energy and the phase in this medium, and therefore, when light propagates from a material having a positive refractive index to a material having a negative refractive index, the incident light and the refracted light are provided on a same side of the normal line of the interface, thereby changing the direction of propagation of the light.

Figure 5:
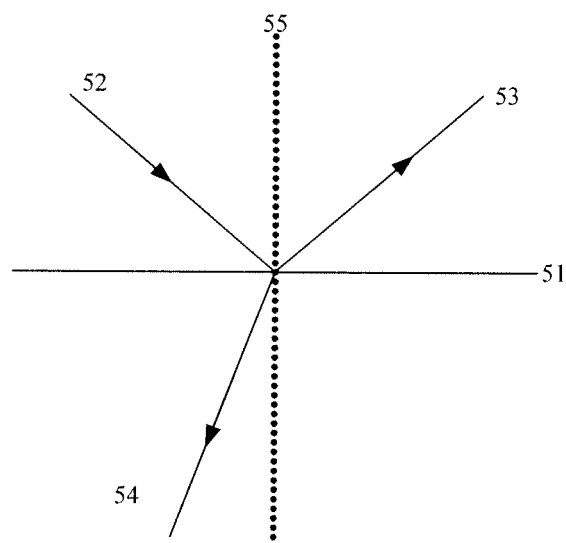
FIG. 5 is a schematic diagram illustrating light propagation through a grid-layer dielectric.

FIG. 5 is a schematic diagram illustrating light propagation through a grid-layer dielectric. As illustrated in FIG. 5, when incident light 52 is incident to the interface 51 between a medium having a positive refractive index and a medium having a negative refractive index, the reflected light 53 is reflected by the medium interface 51 to another side of the normal line 55, and the refracted light 54 passes the medium interface 51 and thereafter is deflected to the same side of the normal line 55. The filler-layer medium may be formed of an obliquely-grown nanorod thin film which has a refractive index gradually becoming from a large value to a small value along the direction away from the grid layer 31.

Figure 6:
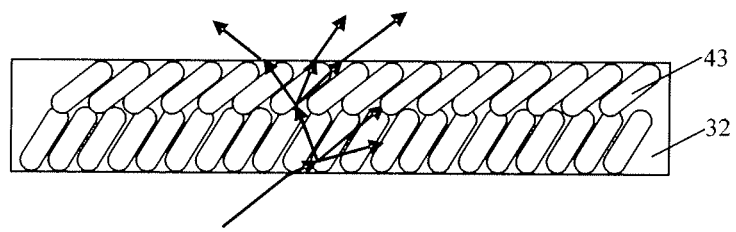
FIG. 6 is a schematic diagram illustrating light scattering propagation through a filler-layer dielectric.

FIG. 6 is a schematic diagram illustrating light scattering propagation through a filler-layer medium. As illustrated in FIG. 6, when light passes through the filler layer 32, the nanorod structure 43 in the filler layer 32 scatters the light, so that the light will propagate in multiple directions and thus the OLED has more uniform light emission, and therefore, light-scattering and antireflective capability can be obtained.

The OLED encapsulating structure provided by this embodiment comprises: an OLED, barrier layers and optical modulation layers; the barrier layers and the optical modulation layers are alternately and periodically formed on the OLED in accordance with a number of alternating cycles. The optical modulation layers can enhance the light-scattering emission capability of the OLED and change the propagation directions of part of light, thereby reducing viewing-angle dependence of the OLED caused by a micro-cavity effect, and improving the contrast ratio of the OLED. The barrier layers can act effectively as an oxygen-and-water barrier, which can block moisture and oxygen from penetrating into the inside of the OLED, thereby preventing moisture and oxygen from corroding the organic functional layer and the electrode material of the OLED, and improving the device lifetime. In one embodiment, when there are a plurality of barrier layers which are alternately provided with the optical modulation layer, they can more effectively prevent the penetrated moisture and oxygen from corroding the organic functional layer and the electrode material of the OLED, thereby improving the sealing performance of the OLED. Moreover, when there are a plurality of optical modulation layers which are alternately provided with the barrier layers, they can more effectively reduce viewing-angle dependence caused by a micro-cavity effect.

The manufacturing method of an OLED encapsulating structure, provided by the second embodiment of the present disclosure, comprises the steps as follows.

Step 1, an OLED is prepared on a base substrate. One example of step 1 comprises the following sub-steps 11-13.

Step 11, an anode is formed on a base substrate. For example, the material of the anode 12 may be silver (Ag), indium tin oxide/silver/indium tin oxide (ITO/Ag/ITO), or nickel-chrome alloy (Ni:Cr alloy).

Step 12, an organic light emitting layer is formed on the anode. The organic light emitting layer may be the same as the above-described examples in the first embodiment, which will be not repeated any more here.

Step 13, a cathode is formed on the organic light emitting layer. For example, the material of the cathode may be magnesium-silver alloy (Mg:Ag alloy), aluminum/silver (Al/Ag) or calcium/silver (Ca/Ag).

Step 2, barrier layers and optical modulation layers are alternately and periodically formed on the OLED. In this embodiment, barrier layers and optical modulation layers may be alternately and periodically formed on the OLED in accordance with a number of alternating cycles, and in each alternating cycle, the optical modulation layer is provided above the barrier layer.

The number of alternating cycles is a positive integer. Preferably, the number of alternating cycles n may be a positive integer, e.g., greater than or equal to 1 and less than or equal to 10, i.e., $1 \leq n \leq 10$.

One example of step 2 may comprise the following sub-steps 21-23.

Step 21, one barrier layer is formed.

The barrier layer may comprise an inorganic insulating layer and an organic insulating layer, and one example of step 21 may comprise the following sub-steps 211-212.

Step 211, an inorganic insulating layer is formed.

The inorganic insulating layer is formed by magnetron sputtering method, or by plasma-enhanced chemical vapor deposition, or by plasma-assisted chemical vapor deposition. The material of the inorganic insulating layer may comprise: an oxide, a sulfide, a nitride, a nitrogen oxide or a carbon film, for example, the material of the inorganic insulating layer may be aluminum oxide ($Al_2O_3$), silicon nitride ($Si_3N_4$), silicon oxynitride (SiOxNy), or diamond-like carbon.

Step 212, an organic insulating layer is formed on the inorganic insulating layer.

The material used for the organic insulating layer may be formed on the inorganic insulating layer by spray-coating, spin-coating or vacuum thermal evaporation, and then the material used for the organic insulating layer is subjected to a curing treatment to form the organic insulating layer. The material of the organic insulating layer may be UV-curable adhesive, polymethyl methacrylate, polyimide, parylene, polyacrylate or acrylate monomer.

Step 22, one optical modulation layer is formed on the barrier layer.

The optical modulation layer may comprise a grid layer and a filler layer provided on the grid layer, and one example of step 22 may comprise the following sub-steps 221-222.

Step 221, a grid layer is formed on the barrier layer. The grid layer is formed on the organic insulating layer in the barrier layer. The grid layer is formed of a successively obliquely-grown nanorod thin film in a tri-layer structure of metal/dielectric/metal. The successively obliquely-grown nanorod thin film in a tri-layer structure of metal/dielectric/metal is formed on the barrier layer, by electron-beam evaporation, at a preset incident angle. The metal may be silver (Ag), aluminum (Al) or a mixture of silver and aluminum, and the dielectric may be silicon dioxide ($SiO_2$) and magnesium fluoride ($MgF_2$). Preferably, with the normal line of the substrate as a reference, the preset incident angle $\theta 1$ is greater than 85° and less than 90°, i.e., $85° < \theta 1 < 90°$. In the embodiment of the present disclosure, the value of the preset incident angle $\theta 1$ may be defined depending on the function of the grid layer; in other words, it is sufficient for the value of the preset incident angle $\theta 1$ to be defined to realize the function of the grid layer.

Step 222, a filler layer is formed on the grid layer. The filler layer is formed of an obliquely-upward-grown oxide nanorod thin film. The obliquely-upward-grown oxide nanorod thin film is formed on the grid layer, by electron-beam evaporation, at an incident angle having an increased gradient within a preset angle range. The oxide may be titanium dioxide ($TiO_2$), aluminum oxide ($Al_2O_3$), zinc oxide (ZnO), magnesium oxide (MgO) or zirconium oxide ($ZrO_2$). The normal line of the substrate is taken as a reference for the incident angle within a preset angle range. Preferably, the preset angle range is between 30° and 90°. For example, the preset angle range may be from 40° to 90° or from 30° to 90°.

Step 23, the above step 21 and step 22 are repeatedly performed for n−1 times, and n is the number of the alternating cycles, and n is a positive integer greater than 1.

In this embodiment, if n=1, then the step 23 need not to be executed.

It should be noted that, in this embodiment, when the step 21 is performed for the first time, the barrier layer is directly formed on the prepared OLED, whereas in the subsequent and repeated performance of step 21, the barrier layer is formed on the filler layer in the optical modulation layer that is formed in the previous alternating cycle.

In practice, optionally, the barrier layers and the optical modulation layers also may be alternately formed in other alternating forms on the OLED. For example, the barrier layers and the optical modulation layers are alternately formed in an order of "barrier layer—optical modulation layer—barrier layer" on the OLED.

The manufacturing method of an OLED encapsulating structure, provided by this embodiment, comprises: forming barrier layers and optical modulation layers alternately and periodically on a prepared OLED in accordance with a number of alternating cycle. The optical modulation layers can enhance the light-scattering emission capability of the OLED and change propagation directions of partial light, thereby reducing viewing-angle dependence of the OLED caused by a micro-cavity effect, and improving the contrast ratio of the OLED. The barrier layers can function effectively as an oxygen-and-water barrier, which can block moisture and oxygen from penetrating into the inside of the OLED, thereby preventing moisture and oxygen from corroding the organic functional layer and the electrode material of the OLED, and improving the device lifetime. In one embodiment, when there are a plurality of barrier layers which are alternately formed with the optical modulation layers, they can more effectively prevent the penetrated moisture and oxygen from corroding the organic functional layer and the electrode material of the OLED, thereby improving the sealing performance of the OLED. Moreover, when there are a plurality of optical modulation layers which are alternately formed with the barrier layers, they can more effectively reduce viewing-angle dependence caused by a micro-cavity effect. In the manufacturing method of an OLED encapsulating structure of this embodiment, the optical modulation layers and the OLED are both prepared in a vacuum environment, that is, the preparation conditions of the optical modulation layers and of the OLED can be similar, thus the optical modulation layers and the OLED have compatibility in the processing procedure; the processing procedure in which glancing angle deposition technique is used to prepare the optical modulation layers, is advantageous for forming a film of a large area, and thus is advantageous for continuous mass production.

Below, the above two embodiments will be described in detail with specific examples.

The manufacturing method of an OLED encapsulating structure, provided by the third embodiment of the present disclosure, comprises the steps as follows.

Step 301, an OLED is prepared on a base substrate.

The step 301 can be the same as the step 1 in the second embodiment. In this embodiment, the material of the anode is silver (Ag), and the material of the cathode is magnesium silver alloy (Mg:Ag alloy).

Step 302, an inorganic insulating layer is formed by magnetron sputtering. The material of the inorganic insulating layer is diamond-like carbon.

Step 303, a UV-curable adhesive is spray-coated on the inorganic insulating layer, then the UV-curable adhesive is subjected to a curing treatment with ultraviolet rays, thus an organic insulating layer is formed.

Step 304, a successively obliquely-grown nanorod thin film in a tri-layer structure of metal/dielectric/metal is formed on the barrier layer, by electron-beam evaporation, at a preset incident angle; the formed successively obliquely-grown nanorod thin film in a tri-layer structure of metal/dielectric/metal is used for a grid layer. The metal is silver (Ag), the dielectric is silicon dioxide (SiO2), and the preset incident angle is 89°.

Step 305, an obliquely-upward-grown oxide nanorod thin film is formed on the grid layer, by electron-beam evaporation, at an incident angle having an increased gradient within an angle range from 40° to 90°; the formed obliquely-upward-grown oxide nanorod thin film is used as a filler layer. The oxide may be titanium dioxide ($TiO_2$), aluminum oxide ($Al_2O_3$) or zinc oxide (ZnO).

Step 306, the steps 302 to 305 are performed repeatedly for n−1 times; n is the number of alternating cycles, and n is a positive integer greater than 1. For example, n is 4 or 6.

In this embodiment, if n=1, then the step 306 needs not to be executed.

The manufacturing method of an OLED encapsulating structure, provided by the fourth embodiment of the present disclosure, comprises the steps as follows.

Step 401, an OLED is prepared on a base substrate.

The step 401 can be the same as the step 1 in the second embodiment. In this embodiment, the material of the anode is indium tin oxide/silver/indium tin oxide (ITO/Ag/ITO), and the material of the cathode is in a dual-layer structure of aluminum/silver (Al/Ag).

Step 402, an inorganic insulating layer is formed by plasma-enhanced chemical vapor deposition. The material of the inorganic insulating layer is silicon nitride ($Si_3N_4$).

Step 403, acrylate monomer is formed on the inorganic insulating layer by vacuum thermal evaporation, then the acrylate monomer is subjected to a curing treatment with ultraviolet rays, thus an organic insulating layer is formed.

Step 404, a successively obliquely-grown nanorod thin film in a tri-layer structure of metal/dielectric/metal is formed on the barrier layer, by electron-beam evaporation, at a preset incident angle; and the formed obliquely-grown nanorod thin film in a tri-layer structure of metal/dielectric/metal is used as a grid layer. The metal is silver (Ag), the dielectric is magnesium fluoride ($MgF_2$), and the preset incident angle is 86°.

Step 405, an obliquely-upward-grown oxide nanorod thin film is formed on the grid layer, by electron-beam evaporation, at an incident angle having an increased gradient within an angle range from 30° to 90°; the formed obliquely-upward-grown oxide nanorod thin film is used as a filler layer. The oxide may be titanium dioxide ($TiO_2$), aluminum oxide ($Al_2O_3$) or zinc oxide (ZnO).

Step 406, the steps 402 to 405 are performed repeatedly for n−1 times; n is the number of alternating cycles, and n is a positive integer greater than 1. For example, n is 4 or 3.

In this embodiment, if n=1, then the step 406 need not to be executed.

The manufacturing method of an OLED encapsulating structure, provided by the fifth embodiment of the present disclosure, may comprise the steps as follows.

Step 501, an OLED is prepared on a base substrate.

The step 501 can be the same as the step 1 in the second embodiment. In this embodiment, the material of the anode is in tri-layer structure of indium tin oxide/silver/indium tin oxide (ITO/Ag/ITO), and the material of the cathode is in dual-layer structure of aluminum/silver (Al/Ag).

Step 502, the inorganic insulating layer is formed by plasma-assisted chemical vapor deposition. The material of the inorganic insulating layer is silicon oxynitride (SiOxNy).

Step 503, polymethyl methacrylate is spray-coated or spin-coated on the inorganic insulating layer, then the polymethyl methacrylate is subjected to a curing treatment with ultraviolet rays, thus the organic insulating layer is formed.

Step 504, a successively obliquely-grown nanorod thin film in a tri-layer structure of metal/dielectric/metal is formed on the barrier layer, by electron-beam evaporation, at a preset incident angle; and the formed successively obliquely-grown nanorod thin film in a tri-layer structure of metal/dielectric/metal is used as a grid layer. The metal is aluminum (Al) or a mixture of silver and aluminum, the dielectric is silicon dioxide ($SiO_2$), and the preset incident angle is 88°.

Step 505, an obliquely-upward-grown oxide nanorod thin film is formed on the grid layer, by electron-beam evaporation, at an incident angle having an increased gradient within an angle range from 30° to 90°; and the formed obliquely-upward-grown oxide nanorod thin film is used as a filler layer. The oxide may be magnesium oxide (MgO), titanium dioxide ($TiO_2$) or zirconium oxide ($ZrO_2$).

Step 506, the steps 502 to 505 are performed repeatedly for n−1 times; n is the number of alternating cycles, and n is a positive integer greater than 1. For example, n is 4 or 3.

In this embodiment, if n=1, then the step 506 need not to be executed.

An embodiment of the present disclosure further provides a light-emitting device, comprising anyone of the described OLED encapsulating structures. An organic light-emitting device after encapsulated in accordance with the any embodiment of the present disclosure can be applied in preparation of organic light-emitting displays, organic transistors, organic integrated circuits, organic solar cells, organic laser machines and/or an organic sensors.

The organic light-emitting display described above can be used for OLED panels, electronic paper devices, mobile phones, tablet computers, televisions, monitors, notebook computers, digital photo frames, navigation systems and any product or component having a display function, etc.

It should be understood that, the above embodiments are merely exemplary implementations used for explaining the principle of the present disclosure, however, the present disclosure is not limited thereto.

What is claimed is:

1. An organic light-emitting device (OLED) encapsulating structure, comprising:
   a base substrate, an OLED, barrier layers and optical modulation layers;
   wherein the OLED is formed on the base substrate; the barrier layers and the optical modulation layers are alternately formed on the OLED,
   wherein the barrier layers and the optical modulation layers are alternately and periodically formed on the OLED in accordance with a number of alternating cycles, and in each alternating cycle, the optical modulation layer is provided above the barrier layer,
   wherein the number of alternating cycles is a positive integer greater than 1 and less than or equal to 10
   wherein each of the optical modulation layers comprises a grid layer and a filler layer provided above the grid layer,
   wherein the filler layer is formed of an obliquely-upward-grown oxide nanorod thin film, and the refractive index of the nanorod thin film becomes from large to small along the direction away from the grid layer.

2. The OLED encapsulating structure according to claim 1, wherein the grid layer is formed of a successively obliquely-grown nanorod thin film in a tri-layer structure of metal/dielectric/metal;
   the metal comprises silver, aluminum or a mixture of silver and aluminum, and the dielectric comprises silicon dioxide or magnesium fluoride.

3. The OLED encapsulating structure according to claim 1, wherein the filler layer is formed of an obliquely-upward-grown oxide nanorod thin film;
   a material of the filler layer comprises titanium dioxide, aluminum oxide, zinc oxide, magnesium oxide or zirconium oxide.

4. The OLED encapsulating structure according to claim 1, wherein the OLED is a top-emission OLED or a double-emission OLED.

5. A method of manufacturing an OLED encapsulating structure, comprising:
   forming an OLED on a base substrate;
   forming barrier layers and optical modulation layers alternately on the OLED,
   wherein forming of the barrier layers and the opitical modulation layers alternately on the OLED comprises:
      forming, barrier layers and optical modulation layers alternately and periodically on the OLED in accordance with a number of alternating cycles, and in each alternating cycle, the optical modulation layer is providod above the, barrier layer,
   wherein forming 0f the barrier layers and the optical modulation layers alternately and periodically on the OLED in accordance with a number of alternating cycles comprises:
      forming one barrier layer;
      forming one optical modulation layer on the one barrier layer;
      repeatedly forming of one barrier layer and forming of one optical modulation layer on, the one barrier layer for n−1 times, where n is the number of alernating cycles and a positive integer greater than 1,
   wherein each of the optical modulation layer comprises a grid layer and a filler layer provided above the grid layer; and forming of one optical modulation layer the one barrier layer comprises:
      forming a grld layer on the barrier layer; and
      forming a filler layer on the grid layer,
   wherein the filler layer is formed of an obliquely-upward-grown oxide nanorod thin film, and the refractive index of the nanorod thin flim becomes from large to small along the direction away from the grid layer.

6. The method of manufacturing an OLED encapsulating structure according to claim 5, wherein the grid layer is formed of a successively obliquely-grown nanorod thin film in a tri-layer structure of metal/dielectric/metal; forming of the grid layer on the barrier layer comprises:
   forming the successively obliquely-grown nanorod thin film in a tri-layer structure of metal/dielectric/metal on the barrier layer, by electron-beam evaporation, at a preset incident angle.

7. The method of manufacturing an OLED encapsulating structure according to claim 6, wherein the preset incident angle is greater than 85° and less than 90°.

8. The method of manufacturing an OLED encapsulating structure according to claim 5, wherein the filler layer is formed of an obliquely-upward-grown oxide nanorod thin film; forming of the filler layer on the grid layer comprises:
   forming an obliquely-upward-grown oxide nanorod thin film on the grid layer, by electron-beam evaporation, at an incident angle having an increased gradient within a preset angle range.

9. The method of manufacturing an OLED encapsulating structure according to claim 8, wherein the preset angle range is between 30° and 90°.

10. A light-emitting device comprising an OLED encapsulating structure accordance with claim 1.

11. The OLED encapsulating structure according to claim 1, wherein the OLED is a double-emission OLED.

12. The OLED encapsulating structure according to claim 1, wherein each of the barrier layers comprises: an inorganic insulating layer and an organic insulating layer provided on the inorganic insulating layer,
   in a first alternating cycle, the inorganic insulating layer of the first alternating cycle covers the OLED and has a thickness greater than that of any other inorganic insulating layer in other alternating cycles.

* * * * *